US012598770B2

(12) United States Patent
Hsiao et al.

(10) Patent No.: US 12,598,770 B2
(45) Date of Patent: Apr. 7, 2026

(54) SEMICONDUCTOR DEVICE AND MANUFACTURING METHOD THEREOF

(71) Applicants: HON HAI PRECISION INDUSTRY CO., LTD., New Taipei City (TW); Hon Young Semiconductor Corporation, Hsinchu City (TW)

(72) Inventors: Yi-Kai Hsiao, New Taipei City (TW); Kuang-Hao Chiang, Hsinchu City (TW); Hao-Chung Kuo, New Taipei City (TW)

(73) Assignees: HON HAI PRECISION INDUSTRY CO., LTD., New Taipei City (TW); Hon Young Semiconductor Corporation, Hsinchu City (TW)

( * ) Notice: Subject to any disclaimer, the term of this patent is extended or adjusted under 35 U.S.C. 154(b) by 425 days.

(21) Appl. No.: 18/467,746

(22) Filed: Sep. 15, 2023

(65) Prior Publication Data

US 2024/0097019 A1 Mar. 21, 2024

(30) Foreign Application Priority Data

Sep. 16, 2022 (TW) .................................. 111135118

(51) Int. Cl.
| | |
|---|---|
| *H10D 30/66* | (2025.01) |
| *H10D 30/01* | (2025.01) |
| *H10D 62/10* | (2025.01) |
| *H10D 62/13* | (2025.01) |
| *H10D 62/17* | (2025.01) |

(52) U.S. Cl.
CPC ......... *H10D 30/66* (2025.01); *H10D 30/0291* (2025.01); *H10D 62/111* (2025.01); *H10D 62/393* (2025.01)

(58) Field of Classification Search
CPC ............. H10D 30/0291; H10D 30/662; H10D 62/157; H10D 62/328
See application file for complete search history.

(56) References Cited

U.S. PATENT DOCUMENTS

| | | | |
|---|---|---|---|
| 10,062,749 B2 | 8/2018 | Chatty et al. | |
| 11,631,762 B1* | 4/2023 | Potera | H10D 62/8325 257/77 |
| 2004/0108547 A1* | 6/2004 | Venkatraman | H10D 30/66 257/E29.198 |

(Continued)

FOREIGN PATENT DOCUMENTS

| | | |
|---|---|---|
| CN | 114242771 A | 3/2022 |
| CN | 115020239 A | 9/2022 |

*Primary Examiner* — Mohsen Ahmadi
(74) *Attorney, Agent, or Firm* — CKC & Partners Co., LLC

(57) ABSTRACT

A semiconductor device includes a substrate, an epitaxial layer, a well region, a source region, a base region, a first JFET region, a second JFET region, a gate dielectric layer and a gate layer. The epitaxial layer is at a side of the substrate. The well region is in the epitaxial layer. The source region is in the well region. The base region is in the well region and adjacent to the source region. The first JFET region is adjacent to the well region. The second JFET region is in the first JFET region. A doping concentration of the second JFET region is higher than a doping concentration of the first JFET region. The gate dielectric layer is at a side of the epitaxial layer away from the substrate. The gate layer is at a side of the gate dielectric layer away from the epitaxial layer.

19 Claims, 20 Drawing Sheets

(56)        References Cited

U.S. PATENT DOCUMENTS

| 2004/0119076 | A1* | 6/2004 | Ryu | .................... | H10D 62/157 |
| | | | | | 257/77 |
| 2004/0164346 | A1* | 8/2004 | Venkatraman | ......... | H10D 30/66 |
| | | | | | 257/E29.198 |
| 2014/0183552 | A1* | 7/2014 | Zhang | ................. | H10D 30/635 |
| | | | | | 257/77 |
| 2014/0183553 | A1* | 7/2014 | Zhang | .................... | H10D 30/66 |
| | | | | | 257/77 |
| 2014/0264579 | A1* | 9/2014 | Pala | .................... | H10D 12/031 |
| | | | | | 257/339 |
| 2015/0034974 | A1* | 2/2015 | Nishio | ................. | H10D 30/662 |
| | | | | | 257/77 |
| 2016/0181365 | A1* | 6/2016 | Bolotnikov | .......... | H10D 62/102 |
| | | | | | 257/329 |

* cited by examiner

SEMICONDUCTOR DEVICE AND MANUFACTURING METHOD THEREOF

CROSS-REFERENCE TO RELATED APPLICATION

This application claims priority to Taiwan Application Serial Number 111135118, filed Sep. 16, 2022, which is herein incorporated by reference in its entirety.

BACKGROUND

Field of Invention

The present disclosure relates to a semiconductor device and a manufacturing method thereof.

Description of Related Art

Silicon carbide power transistors have characteristics of high blocking voltage, low on-resistance, and high thermal conductivity, so that the silicon carbide power transistors get more and more attention. Resistance of the silicon carbide power transistors may be composed of different components in the transistors, such as contact, channel, gate, junction field-effect transistor (JFET) region, and substrate. The resistance of the JFET region accounts for a large portion of the resistance of the silicon carbide power transistors.

SUMMARY

Some embodiments of the present disclosure provide a semiconductor device including a substrate, an epitaxial layer, a well region, a source region, a base region, a first junction field-effect transistor region, a second junction field-effect transistor region, a gate dielectric layer and a gate layer. The epitaxial layer is at a side of the substrate. The well region is in the epitaxial layer. The source region is in the well region. The base region is in the well region and adjacent to the source region. The first junction field-effect transistor region is adjacent to the well region. The second junction field-effect transistor region is in the first junction field-effect transistor region. The first junction field-effect transistor region and the second junction field-effect transistor region include dopants of a first semiconductor type, in which a doping concentration of the second junction field-effect transistor region is higher than a doping concentration of the first junction field-effect transistor region. The gate dielectric layer is at a side of the epitaxial layer away from the substrate. The gate layer is at a side of the gate dielectric layer away from the epitaxial layer.

Some embodiments of the present disclosure provide a manufacturing method of a semiconductor device including forming an epitaxial layer on a substrate. A base region is formed in the epitaxial layer. A sacrificial layer stack is formed on the epitaxial layer, in which the sacrificial layer stack includes a first sub-layer and a second sub-layer on the first sub-layer. A sidewall of the second sub-layer of the sacrificial layer stack is retracted. A source region is formed adjacent to the base region by using the second sub-layer as mask. The sidewall of the second sub-layer of the sacrificial layer stack is retracted again. A well region cladding the base region and the source region is formed by using the second sub-layer after being retracted again. A third sub-layer is deposited on the first sub-layer of the sacrificial layer stack and surrounds the second sub-layer. The second sub-layer is removed, and a first junction field-effect transistor region is formed adjacent to the well region by using the third sub-layer as mask. A spacer is formed at a sidewall of the third sub-layer of the sacrificial layer stack. A second junction field-effect transistor region is formed in the first junction field-effect transistor region by using the spacer as mask.

As mentioned above, the semiconductor device in some embodiments of the present disclosure includes JFET region at different doping concentration. When the doping concentration of the JFET region is lower near the well region and higher at the center, and the doping concentration of the JFET region is higher than the drift region below, the resistance of the JFET region of the semiconductor device may be reduced. Moreover, the dropping of the breakdown voltage, which may cause the semiconductor to be unable to withstand too much driving voltage, of the semiconductor device may be avoided.

It is to be understood that both the foregoing general description and the following detailed description are by examples, and are intended to provide further explanation of the description as claimed.

DETAILED DESCRIPTION

Some embodiments of the present disclosure are related to semiconductor devices and the manufacturing method thereof. Some embodiments of the present disclosure are applicable to the junction field-effect transistor (JFET) region. A two-step ion implantation process may be performed to the JFET region of the semiconductor device, so that the doping concentration of the JFET region increases, thereby reducing the resistance of the JFET region of the semiconductor device. Moreover, the doping concentration of the outside portion of the JFET region is lower. Therefore, the breakdown voltage of the semiconductor device does not decrease significantly, so that the semiconductor device can withstand a certain level of driving voltage.

Figure 1:
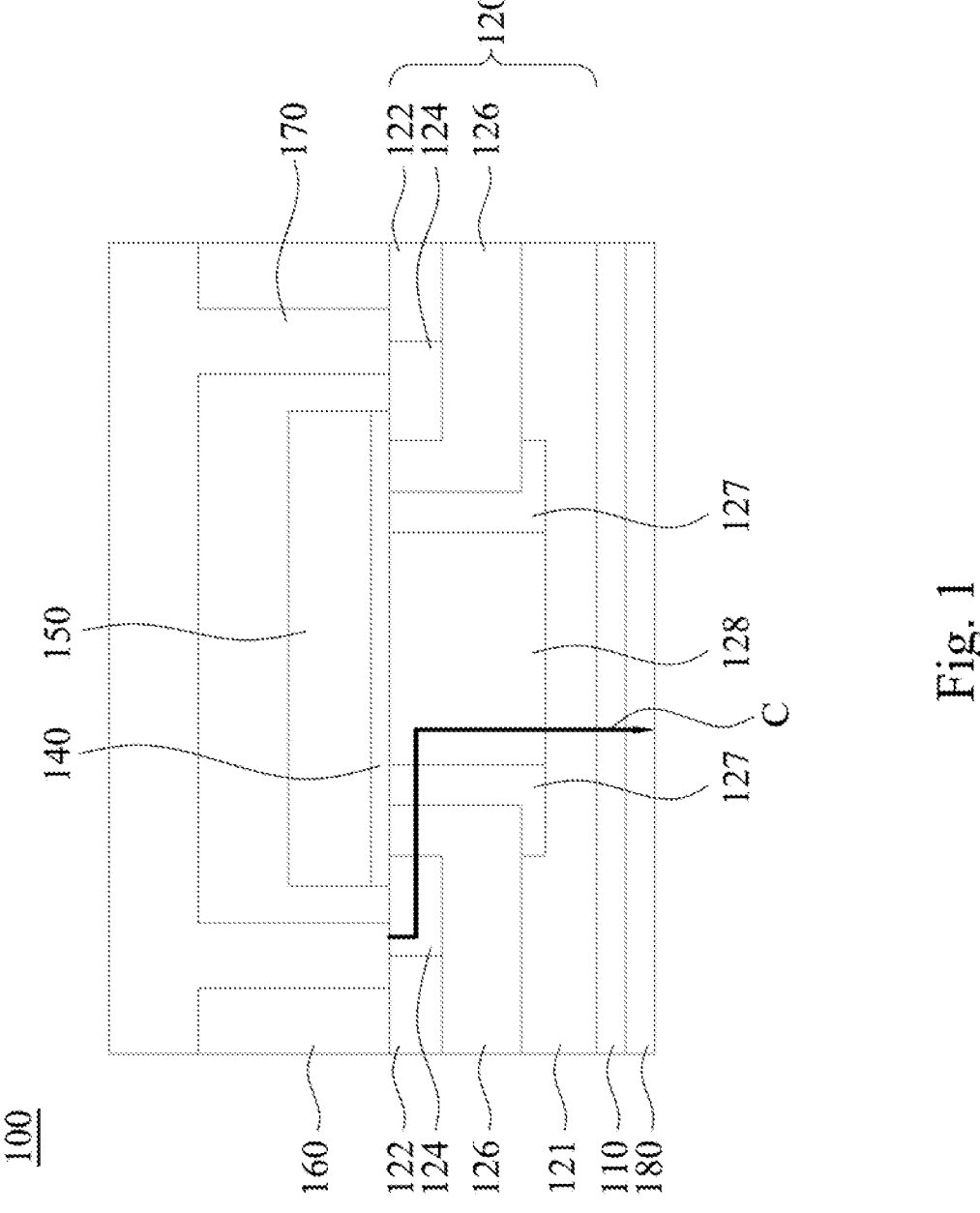
FIG. 1 illustrates a cross-section view of a semiconductor device in some embodiments of the present disclosure.

FIG. 1 illustrates a cross-section view of a semiconductor device 100 in some embodiments of the present disclosure. The semiconductor device 100 includes a substrate 110, an epitaxial layer 120, a drift region 121, well region 126, source regions 124, base regions 122, a first JFET region 127, a second JFET region 128, a gate dielectric layer 140 and a gate layer 150.

The epitaxial layer 120 is at a side of the substrate 110. The well region 126 is in the epitaxial layer 120 and on the drift region 121. The source region 124 is in the well region 126. The base region 122 is in the well region 126 and adjacent to the source region 124. The first JFET region 127 is adjacent to the well region 126. The second JFET region 128 is in the first JFET region 127. The substrate 110, the drift region 121, the source region 124, the first JFET region 127 and the second JFET region 128 include dopants of a first semiconductor type, in which a doping concentration of the second JFET region 128 is higher than a doping concentration of the first JFET region 127, and the doping concentration of the first JFET region 127 and the second JFET region 128 are higher than a doping concentration of the drift region 121. The base region 122 and the well region 126 include dopants of a second semiconductor type, and the second semiconductor type is different from the first semiconductor type. In some embodiments, the first semiconductor type may be N-type, and the dopants of the first semiconductor type may be phosphorous, arsenic, nitrogen, etc. The second semiconductor type may be P-type, and the dopants of the second semiconductor type may be boron, gallium, aluminum, etc. The gate dielectric layer 140 is at a side of the epitaxial layer 120 away from the substrate 110. The gate layer 150 is at a side of the gate dielectric layer 140 away from the epitaxial layer 120.

The semiconductor device 100 further includes a dielectric layer 160, a source contact 170 and a drain electrode 180. The dielectric layer 160 is on the epitaxial layer 120. The source contact 170 is in contact with the source region 124. The drain electrode 180 is at the other side of the substrate 110. The term "the other side" here is relative to the epitaxial layer 120. That is, the drain electrode 180 and the epitaxial layer 120 are at the opposite sides of the substrate 110. When turning on the gate layer 150 of the semiconductor device 100, electron flow flows along the arrow C, passing from the source contact 170 through the source region 124, the well region 126, the first JFET region 127, the second JFET region 128, the drift region 121, the substrate 110 to the drain electrode 180. Compared to the drift region 121, the doping concentration of the first JFET region 127 and the second JFET region 128 are higher, so the resistance of the first JFET region 127 and the second JFET region 128 may be reduced, thereby reducing the resistance of the semiconductor device 100. Moreover, in order to avoid the decrease of the breakdown voltage of the semiconductor device 100, which may cause the semiconductor device 100 to be unable to withstand too much driving voltage, the doping concentration of the second JFET region 128 may be designed to be higher than the doping concentration of the first JFET region 127. That is, the doping concentration of the first JFET region 127 close to the well region 126 is lower than the doping concentration of the second JFET region 128 away from the well region 126.

Figure 2:
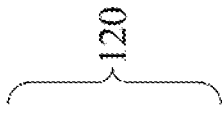
FIGS. 2-19 illustrate cross-section views of the manufacturing method of the semiconductor device in some embodiments of the present disclosure.
Figure 2:
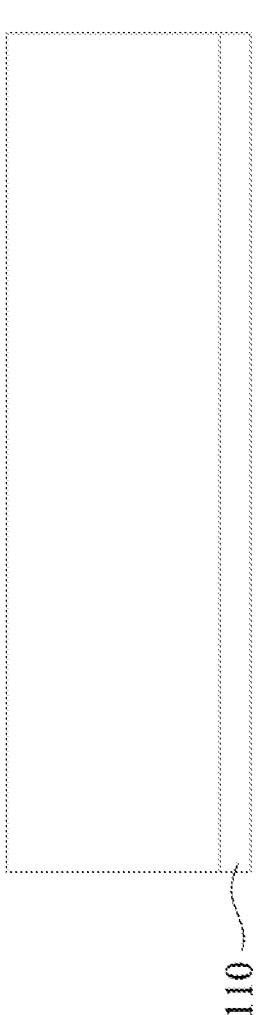

FIGS. 2-19 illustrate cross-section views of the manufacturing method of the semiconductor device 100 in some embodiments of the present disclosure. Referring to FIG. 2, the substrate 110 and the epitaxial layer 120 are provided. The substrate 110 may be any suitable substrate. In some embodiments, the substrate 110 may be made of (but not limited to) silicon carbide. The substrate 110 may be doped with dopants of the first semiconductor-type. For example, the substrate 110' may be N-type heavily doped substrate, such as the heavily doped region including N-type dopants such as phosphorous, arsenic, nitrogen, etc. Subsequently, the epitaxial layer 120 is formed on the substrate 110. In some embodiments, the epitaxial layer 120 may be made of (but not limited to) silicon carbide. The epitaxial layer 120 may be doped with dopants of the first semiconductor-type. For example, the epitaxial layer 120 may be N-type lightly doped substrate, such as the lightly doped region including N-type dopants such as phosphorous, arsenic, nitrogen, etc. That is, the doping concentration of the epitaxial layer 120 may be lower than that of the substrate 110.

Figure 3:
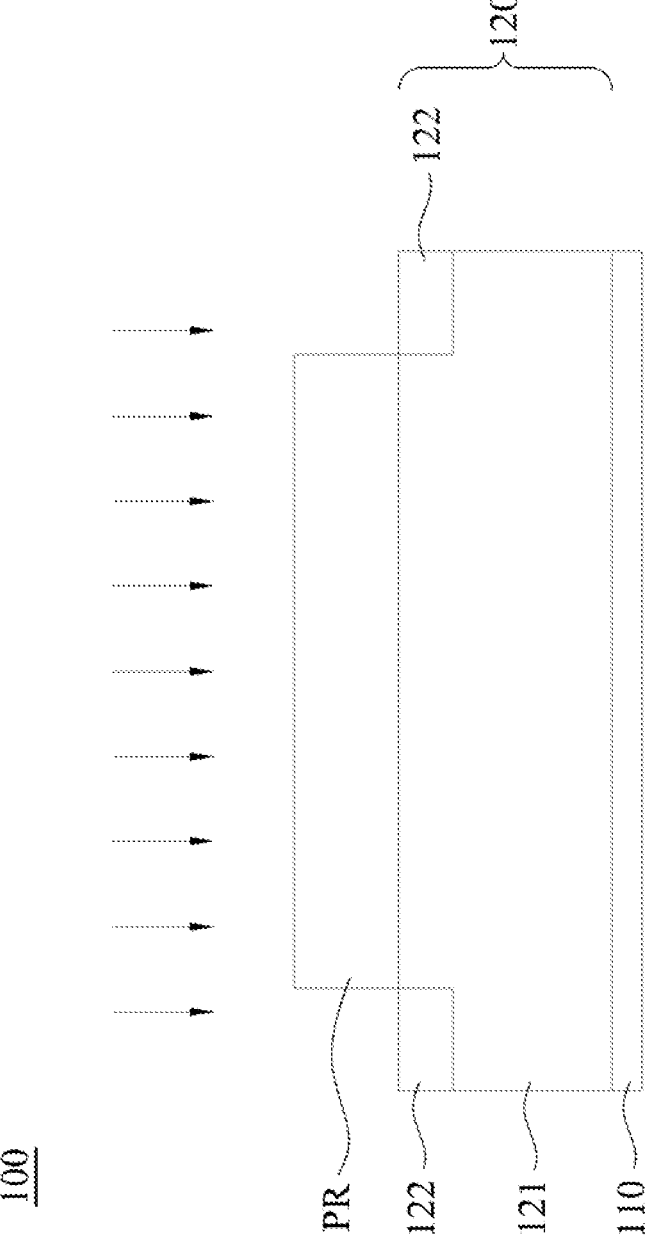
Figure 4:
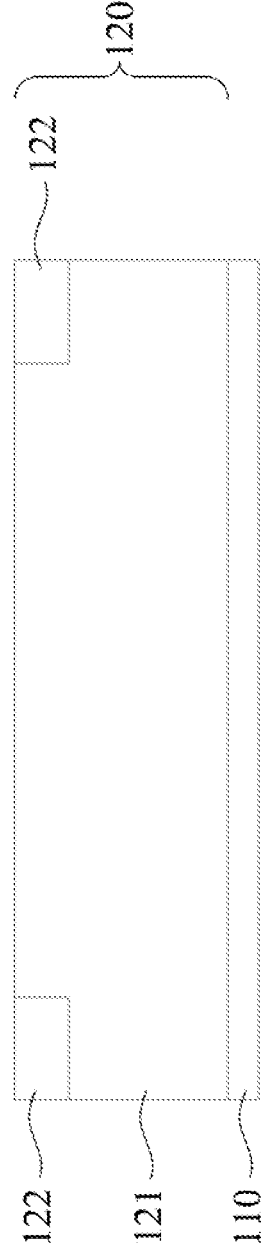

Referring to FIG. 3, the base regions 122 are formed in the epitaxial layer 120. More specifically, a photoresist material may be firstly coated on the epitaxial layer 120. Subsequently, the photoresist material is exposed by using opaque photomask, and the photoresist material is developed to form a photoresist layer PR on the epitaxial layer 120. The photoresist layer PR exposes a portion of the epitaxial layer 120. Subsequently, an ion implantation process of the second semiconductor type is performed by using the photoresist layer PR as mask to form the base regions 122 in the epitaxial layer 120. In some embodiments, the base regions 122 may be P-type heavily doped regions, such as heavily doped regions including P-type dopants such as boron, gallium, aluminum, etc. After forming the base regions 122, the epitaxial layer 120 may be divided into the base regions 122 doped with ions of second semiconductor type and the drift region 121 not doped with ions of second semiconductor type. Therefore, the drift region 121 still remains as N-type lightly doped region. In some embodiments, the doping concentration of the drift region 121 may be in a range of 1E16 atoms/cm$^3$ to 1E19 atoms/cm$^3$. Subsequently, referring to FIG. 4, the photoresist layer PR is removed. The photoresist layer PR may be removed by ashing, etching, etc.

Figure 5:
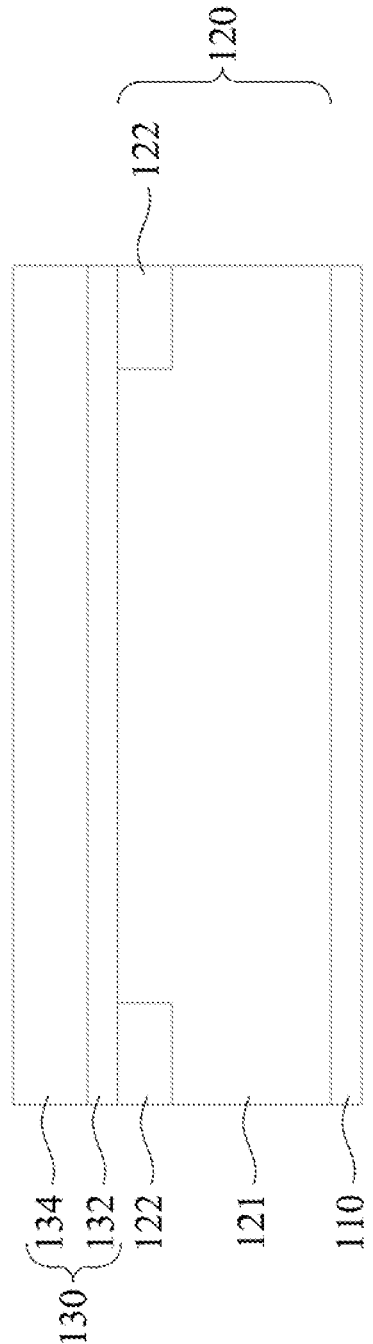

Referring to FIG. 5, a sacrificial layer stack 130 is formed on the epitaxial layer 120, and the sacrificial layer stack 130 includes a first sub-layer 132 and a second sub-layer 134 on the first sub-layer 132. More specifically, the first sub-layer 132 may be firstly formed on the epitaxial layer 120, and then the second sub-layer 134 is formed on the first sub-layer 132. The first sub-layer 132 and the second sub-layer 134 are made of different materials. In some embodiments, the first sub-layer 132 is made of silicon dioxide, and the second sub-layer 134 is made of silicon nitride.

Figure 6:
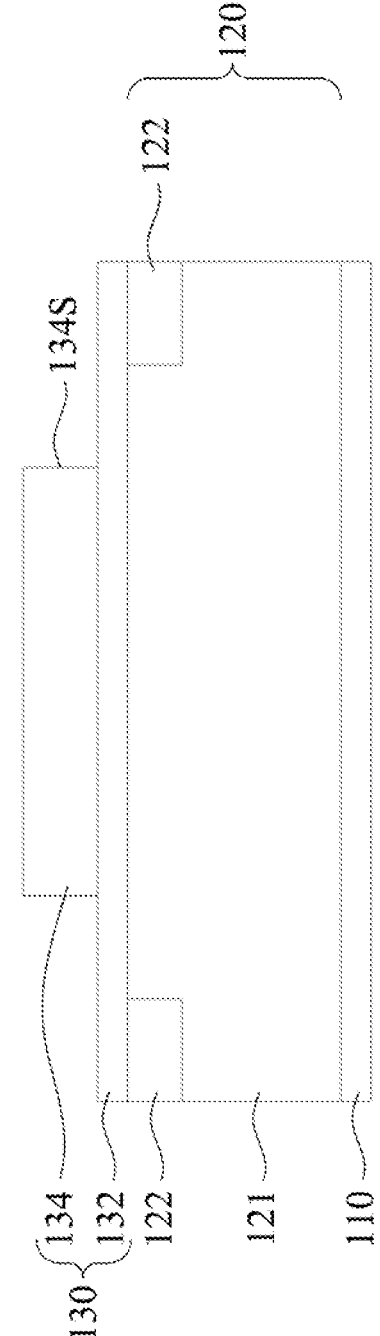

Referring to FIG. 6, the sidewalls 134S of the second sub-layer 134 of the sacrificial layer stack 130 are retracted. More specifically, a wet etchant with high etching selectivity to the second sub-layer 134 may be selected. That is, a wet etchant which is easy to etch the second sub-layer 134 but not easy to etch the first sub-layer 132 may be selected to expose the first sub-layer 132 below, and the vertical projection of the second sub-layer 134 on the epitaxial layer 120 does not overlap the base regions 122. A distance is between the vertical projection of the second sub-layer 134 on the epitaxial layer 120 and the base region 122. In this embodiment, the first sub-layer 132 is still in place and is not etched. When the first sub-layer 132 is made of silicon dioxide and the second sub-layer 134 is made of silicon nitride, the wet etchant may be hot phosphoric acid.

Figure 7:
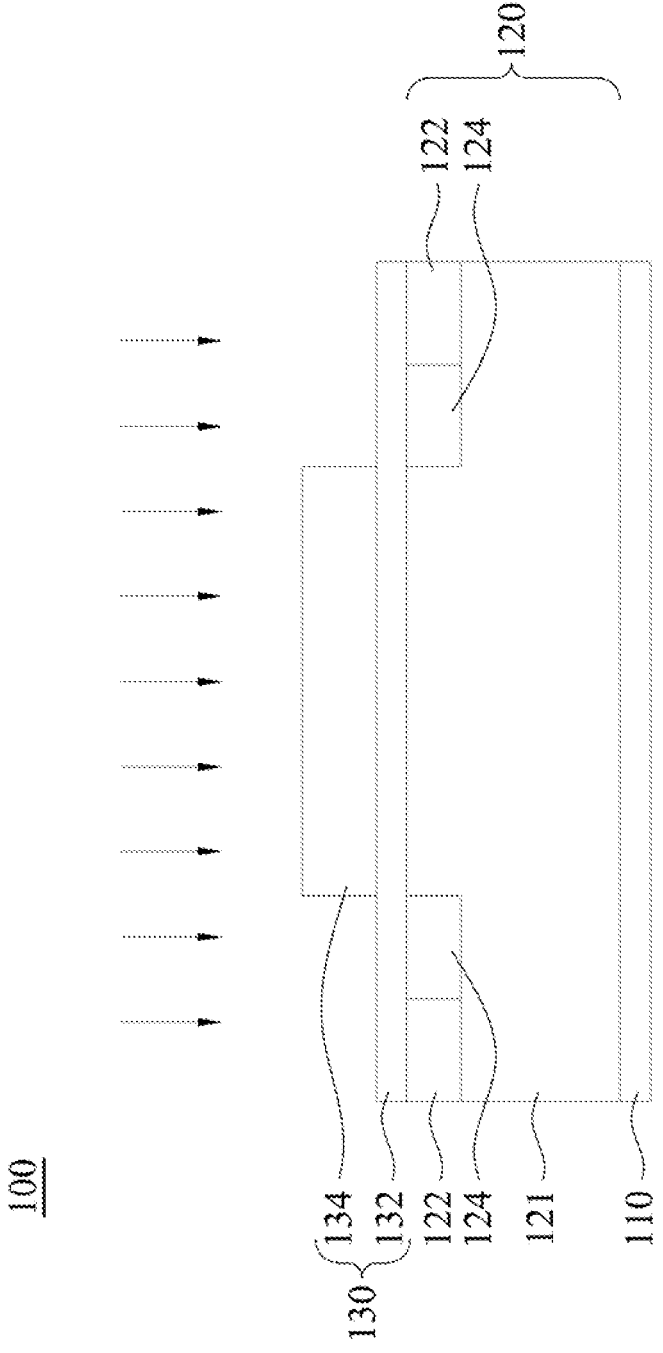

Referring to FIG. 7, the source regions 124 are formed adjacent to the base regions 122 by using the second sub-layer 134 as mask. More specifically, an ion implantation process of the first semiconductor type is performed to form the source regions 124 in the epitaxial layer 120. In some embodiments, the source regions 124 may be N-type heavily doped region, such as heavily doped region including N-type dopants such as phosphorous, arsenic, nitrogen, etc. The dopants may penetrate through the first sub-layer 132 and are implanted to the epitaxial layer 120. The source region 124 is formed between the base region 122 and the vertical projection of the second sub-layer 134 on the epitaxial layer 120. In some embodiments, the doping concentration of the source region 124 is higher than the doping concentration of the drift region 121. In some embodiments, when forming the source regions 124, a hard mask layer may be formed on the base regions 122, so the base regions 122 are not affected when forming the source regions 124. Alternatively, the doping concentration of the base regions 122 may be increased in FIG. 3. Therefore, the ion concentration of the base regions 122 may be adjusted to a desired concentration during forming the source regions 124.

Figure 8:
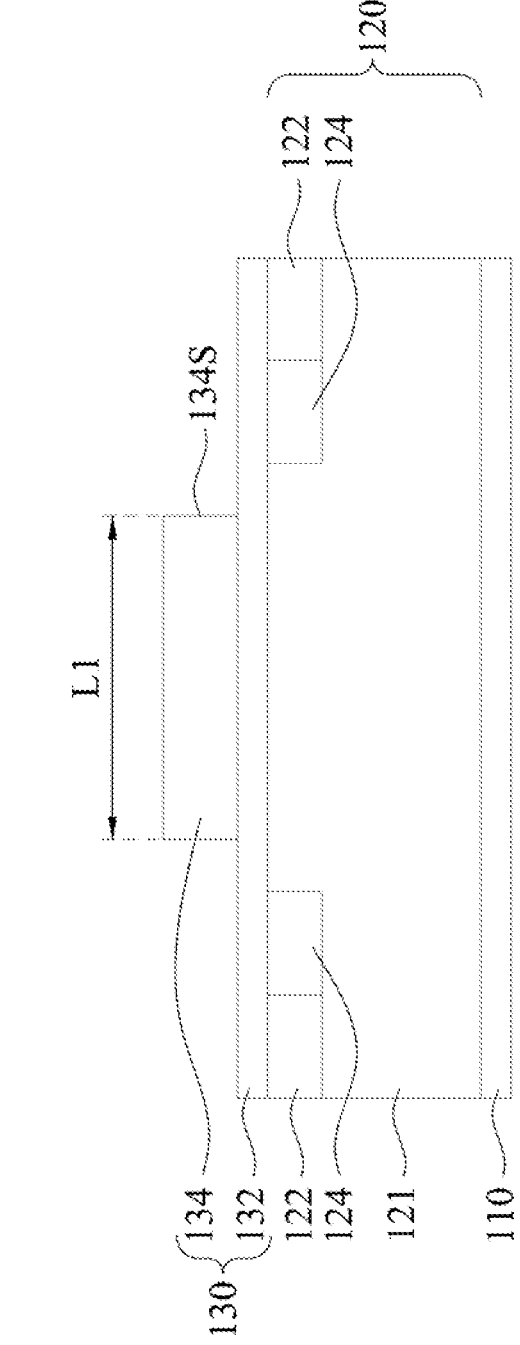

Referring to FIG. 8, the sidewall 134S of the second sub-layer 134 of the sacrificial layer stack 130 are retracted again. In some embodiments, the same wet etchant as described in FIG. 6 may be used to retract the sidewalls 134S of the second sub-layer 134 of the sacrificial layer stack 130, so that the vertical projection of the second sub-layer 134 on the epitaxial layer 120 does not cover the base regions 122 and the source regions 124. A distance is between the vertical projection of the second sub-layer 134 on the epitaxial layer 120 and the source region 124. In this embodiment, the first sub-layer 132 is still in place and is not etched. In some embodiments, the length L1 of the second sub-layer 134 after being retracted again may be in a range of 0.8 micron to 1.2 micron.

Figure 9:
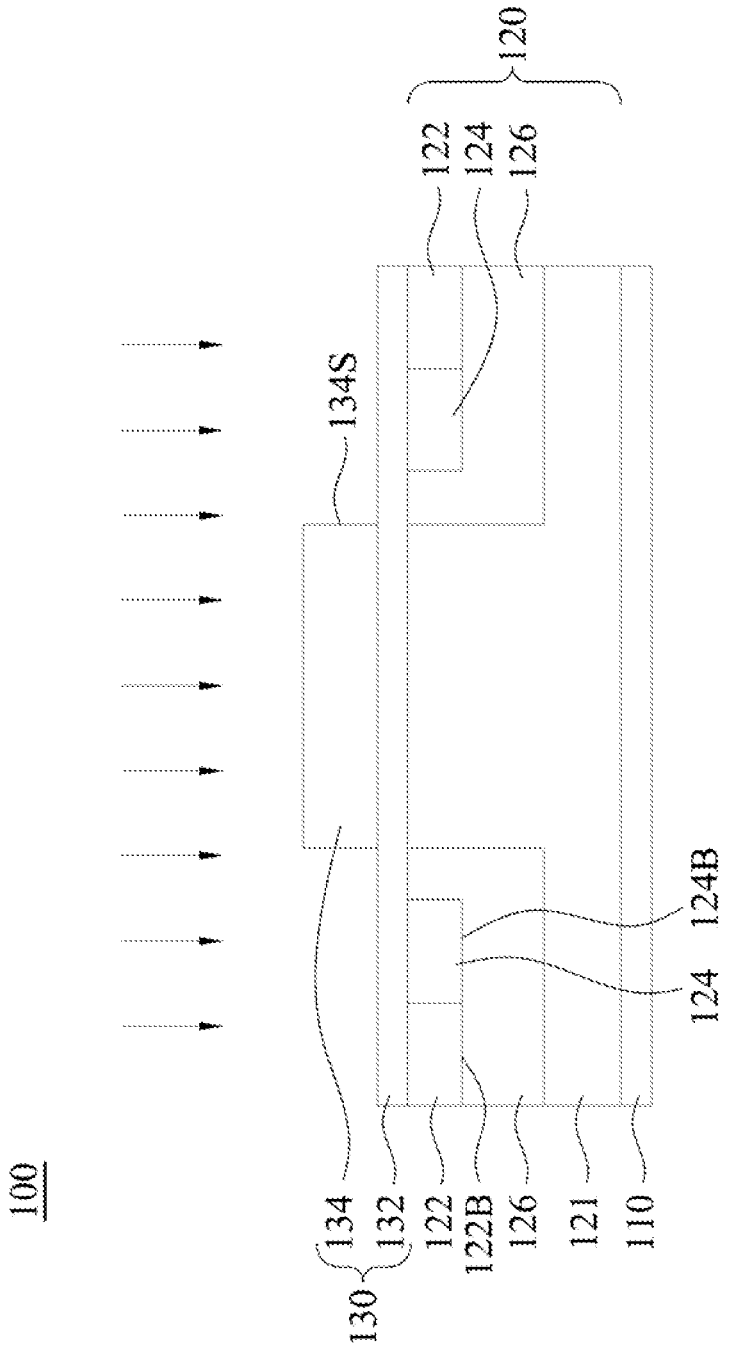

Referring to FIG. 9, the well regions 126 cladding the base regions 122 and the source regions 124 are formed by using the second sub-layer 134 after being retracted again as a mask. More specifically, an ion implantation process of the second semiconductor type is performed to the epitaxial layer 120 to form the well regions 126 in the epitaxial layer 120. The dopants may penetrate through the first sub-layer 132 and are implanted to the epitaxial layer 120. The well region 126 is formed between the source region 124 and the vertical projection of the second sub-layer 134 on the epitaxial layer 120, and extends downwards to below the base region 122 and the source region 124. The well region 126 clads the bottom 124B of the source region 124 and the bottom 122B of the base region 122. The boundary of the well region 126 is substantially aligned with the sidewall 134S of the second sub-layer 134. In some embodiments, the well regions 126 may be P-type lightly doped regions, such as lightly doped regions including P-type dopants such as boron, gallium, aluminum, etc., and the doping concentration of the well region 126 is lower than the doping concentration of the base region 122. Therefore, when forming the well regions 126, the doping concentration of the base regions 122 and the source regions 124 is not affected.

Figure 10:
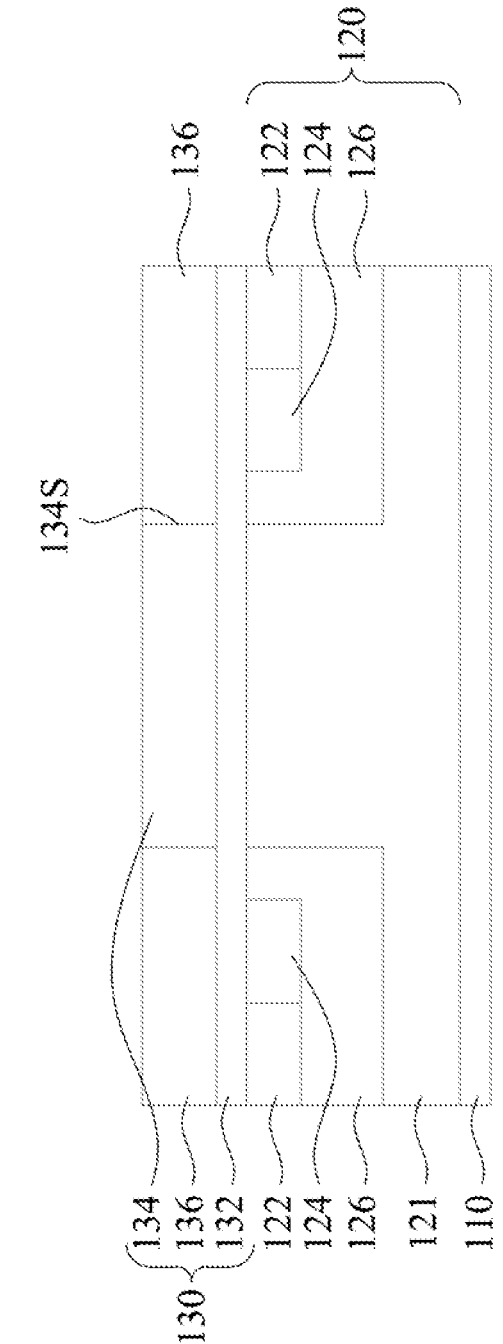

Referring to FIG. 10, a third sub-layers 136 is deposited on the first sub-layer 132 of the sacrificial layer stack 130 and surrounding the second sub-layer 134. More specifically, a material layer made of the same material as the first sub-layer 132 may be formed on the first sub-layer 132 and the second sub-layer 134. Subsequently, the material layer on the second sub-layer 134 is removed, so the third sub-layer 136 still covering the first sub-layer 132 but exposing the second sub-layer 134 is formed. As such, the third sub-layer 136 surrounds the second sub-layer 134.

Figure 11:
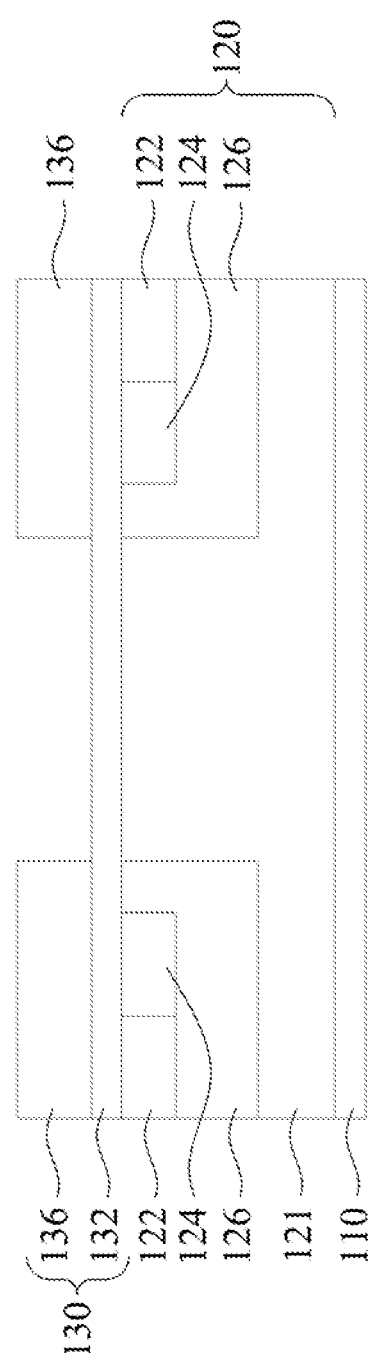
Figure 12:
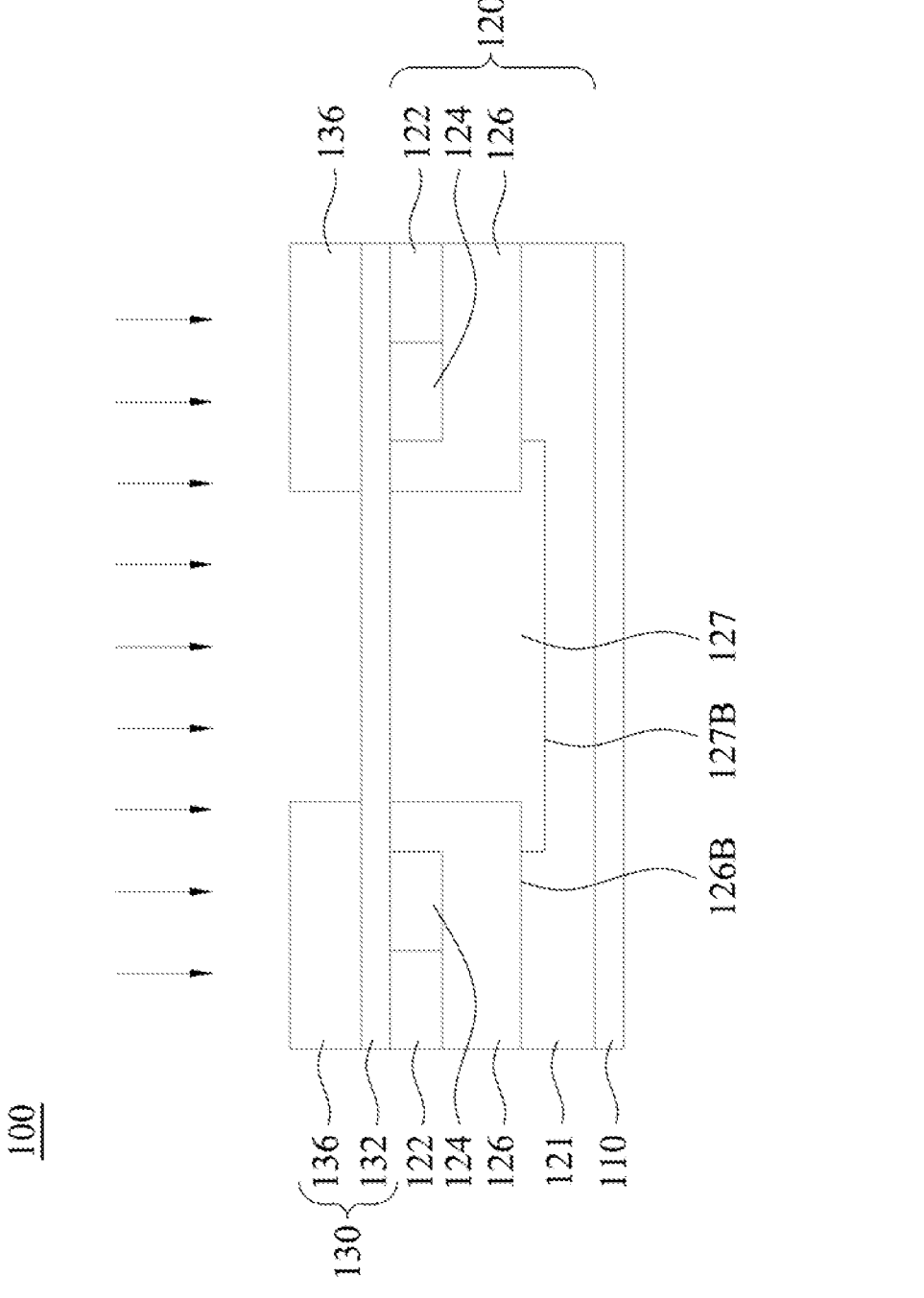

Referring to FIGS. 11-12, the second sub-layer 134 is removed, and the first JFET region 127 adjacent to the well regions 126 is formed by using the third sub-layer 136 as mask. Since the material of the second sub-layer 134 is different from the material of the first sub-layer 132 and the third sub-layer 136, a suitable wet etchant may be selected to remove the second sub-layer 134. In some embodiments, the same wet etchant as described in FIG. 6 may be used to remove the second sub-layer 134. Since the positions of the well regions 126 are defined by the second sub-layer 134, the drift region 121 between adjacent well regions 126 in the epitaxial layer 120 may be exposed after removing the second sub-layer 134.

Subsequently, an ion implantation process of the first semiconductor type is performed to form the first JFET region 127 between the adjacent well regions 126. In some embodiments, the first JFET region 127 may be N-type heavily doped region, such as heavily doped region including N-type dopants such as phosphorous, arsenic, nitrogen, etc. The doping concentration of the first JFET region 127 may be higher than the doping concentration of the drift region 121. In some embodiments, the doping concentration of the first JFET region 127 may be in a range of 3E11 atoms/cm$^3$ to 5E13 atoms/cm$^3$. The depth of the first JFET region 127 may be controlled, so that the bottom 127B of the first JFET region 127 is closer to the substrate 110 than the bottom 126B of the well region 126 is.

Figure 13:
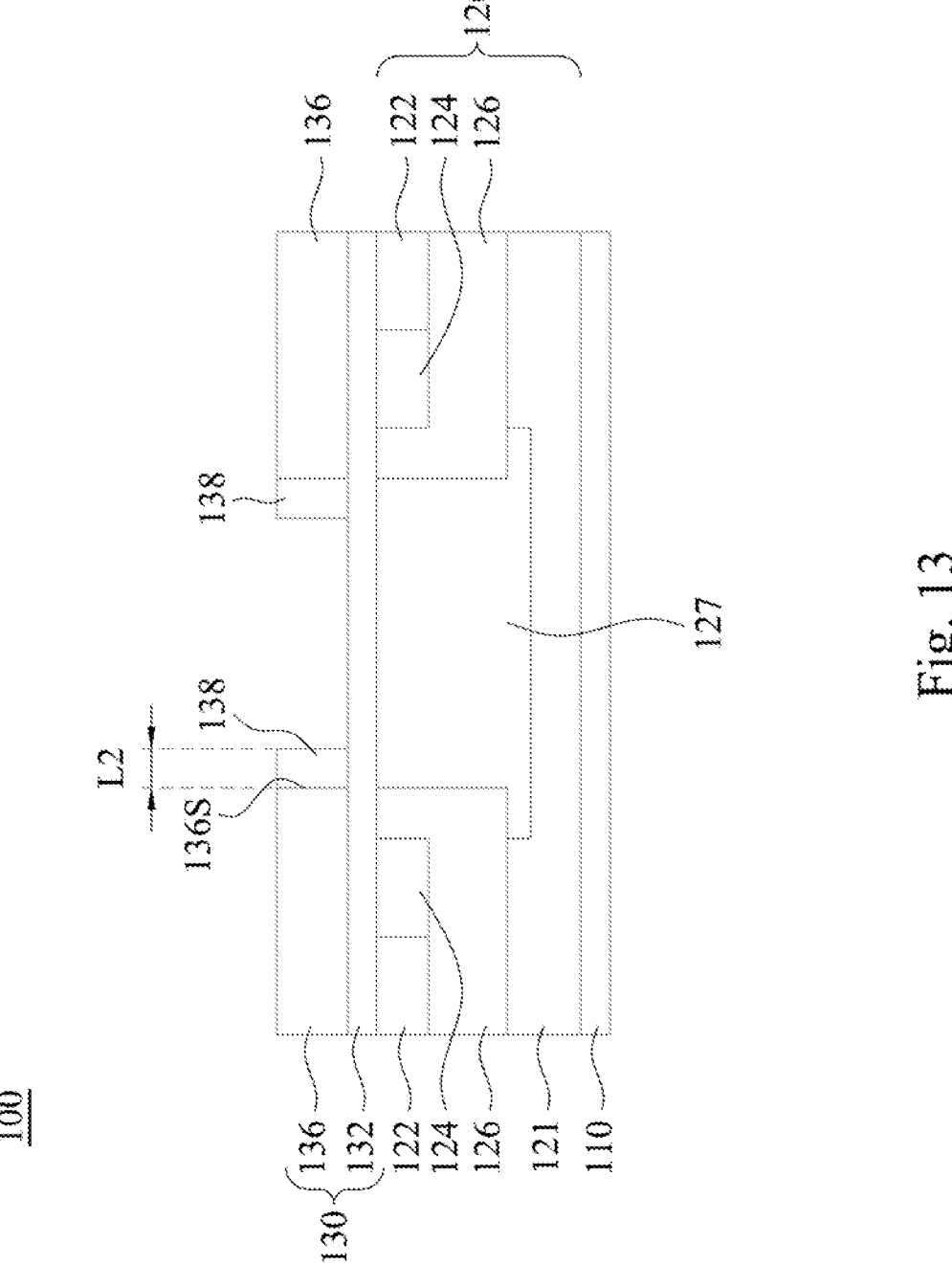

Referring to FIG. 13, spacers 138 are formed at the sidewalls 136S of the third sub-layer 136 of the sacrificial layer stack 130. More specifically, a dielectric material layer conformal to the first sub-layer 132 and the third sub-layer 136 may be firstly formed on the sacrificial layer stack 130. The dielectric material layer is along the top surface of the first sub-layer 132 and the third sub-layer 136 and the sidewalls 136S of the third sub-layer 136. Subsequently, the dielectric material layer on the first sub-layer 132 and the third sub-layer 136 is removed to form the spacers 138 remaining at the sidewalls 136S of the third sub-layer 136, and vertical projection of the spacers 138 on the epitaxial layer 120 covers a portion of the first JFET region 127. The spacers 138 may be made of any suitable dielectric material, such as silicon dioxide silicon nitride, the like, or combinations thereof. In some embodiments, the length L2 of the spacer 138 may be in a range of 50 nm to 200 nm.

Figure 14:
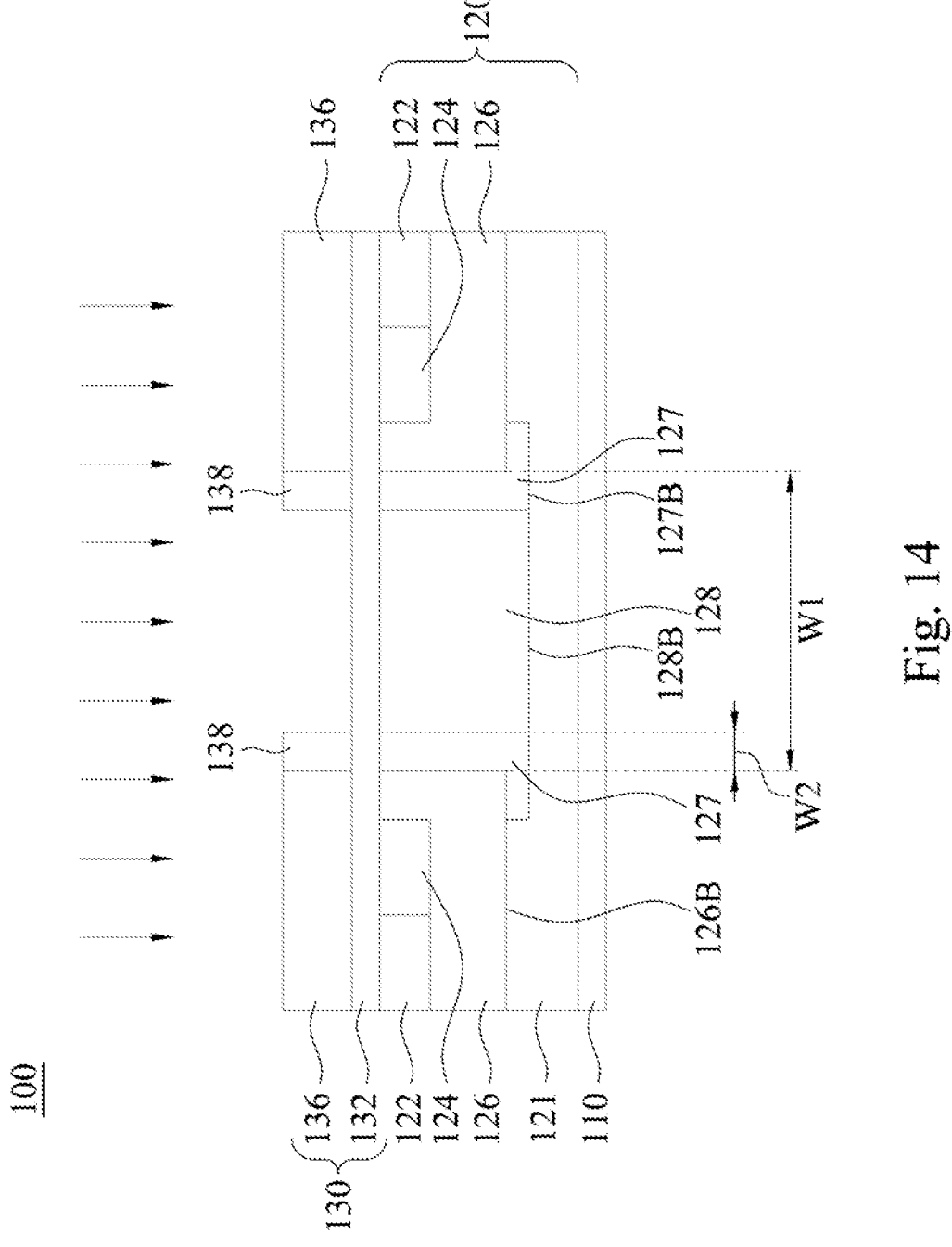

Referring to FIG. 14, the second JFET region 128 is formed in the first JFET region 127 by using the spacers 138 as mask. More specifically, an ion implantation process of the first semiconductor type is performed to form the second JFET region 128 in the first JFET region 127. In some embodiments, the second JFET region 128 may be N-type heavily doped region, such as heavily doped region including N-type dopants such as phosphorous, arsenic, nitrogen, etc. The doping concentration of the second JFET region 128 is higher than the doping concentration of the first JFET region 127. The doping concentration of the second JFET region 128 may be in a range of the 1E11 atoms/cm$^3$ to 5E13 atoms/cm$^3$. Since the vertical projection of the spacers 138 on the epitaxial layer 120 covers the outside portion of the first JFET region 127, the second JFET region 128 is surrounded by the first JFET region 127. The well region 126 and the second JFET region 128 may be separated by the first JFET region 127. The depth of the second JFET region 128 is controlled, so that the bottom 12B of the second JFET region 128 is lower than the bottom 126B of the well region 126. In some embodiments, the width W1 of the overall JFET region (including the first JFET region 127 and the second JFET region 128) and the width W2 of the first JFET region 127 may be controlled by controlling the length L1 of the second sub-layer 134 in FIG. 8 and the length L2 of the spacer 138 in FIG. 13. The width W1 of the overall JFET region (including the first JFET region 127 and the second JFET region 128) and the width W2 of the first JFET region 127 are same as the length L1 of the second sub-layer 134 in FIG. 8 and the length L2 of the spacer 138 in FIG. 13 respectively.

Compared to the drift region 121, the doping concentration of the first JFET region 127 and the second JFET region 128 is higher, so the resistance of the first JFET region 127 and the second JFET region 128 are reduced, thereby reducing the resistance of the semiconductor device 100. Moreover, the doping concentration of the second JFET region 128 may be higher than the doping concentration of the first JFET region 127. Therefore, the dropping of the breakdown voltage, which may cause the semiconductor to be unable to withstand too much driving voltage, of the semiconductor device 100 may be avoided. Moreover, in some embodiments, the bottom 127B of the first JFET region 127 and the bottom 128B of the second JFET region 128 are lower than the bottom 126B of the well region 126, and expand below the bottom 126B of the well region 126. Therefore, the first JFET region 127 and the second JFET region 128 may also be used to enlarge the flowing range of the electron flow.

Figure 15:
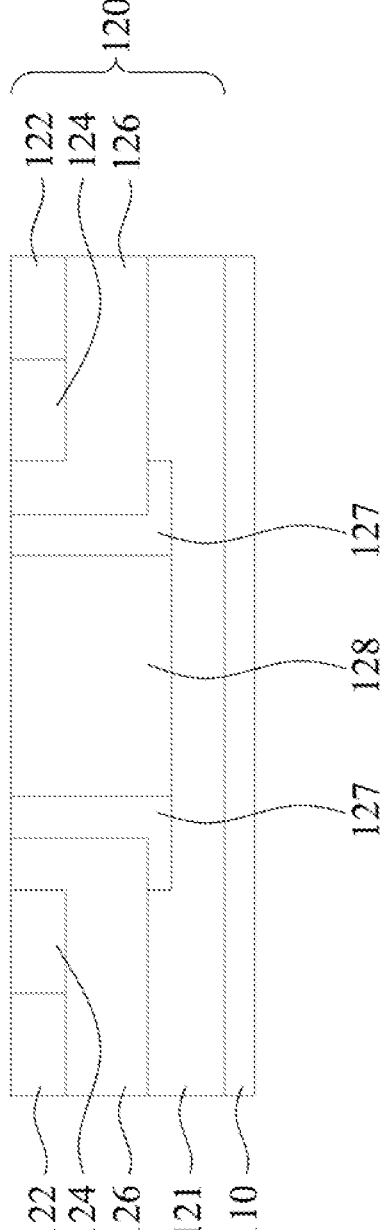

Subsequently, referring to FIG. 15, the sacrificial layer stack 130 and the spacers 138 are removed. In some embodiments, after or before removing the sacrificial layer stack 130 and the spacers 138, an annealing process is performed on the first JFET region 127 and the second JFET region 128. In some embodiments, the temperature of the annealing process is in a range of 1400 degree Celsius to 1800 degree Celsius. Therefore, the ions in the first JFET region 127 and the second JFET region 128 may be activated, and the lattice damage resulting from the ion implantation is repaired.

Figure 16:
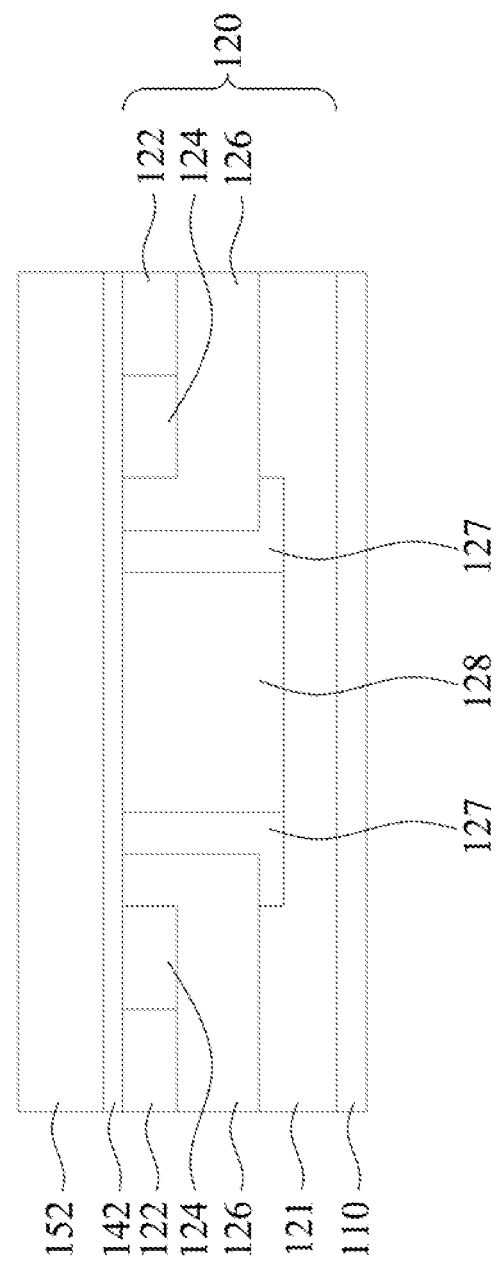

Subsequently, referring to FIG. 16, a dielectric layer 142 is formed on the epitaxial layer 120, and a conductive layer 152 is formed on the dielectric layer 142. In some embodiments, the dielectric layer 142 may include silicon oxide, silicon nitride, silicon oxynitride, polysilicon, combinations thereof or the like. In some embodiments, the conductive layer 152 may include polysilicon, metal, metal compound, combinations thereof or the like.

Figure 17:
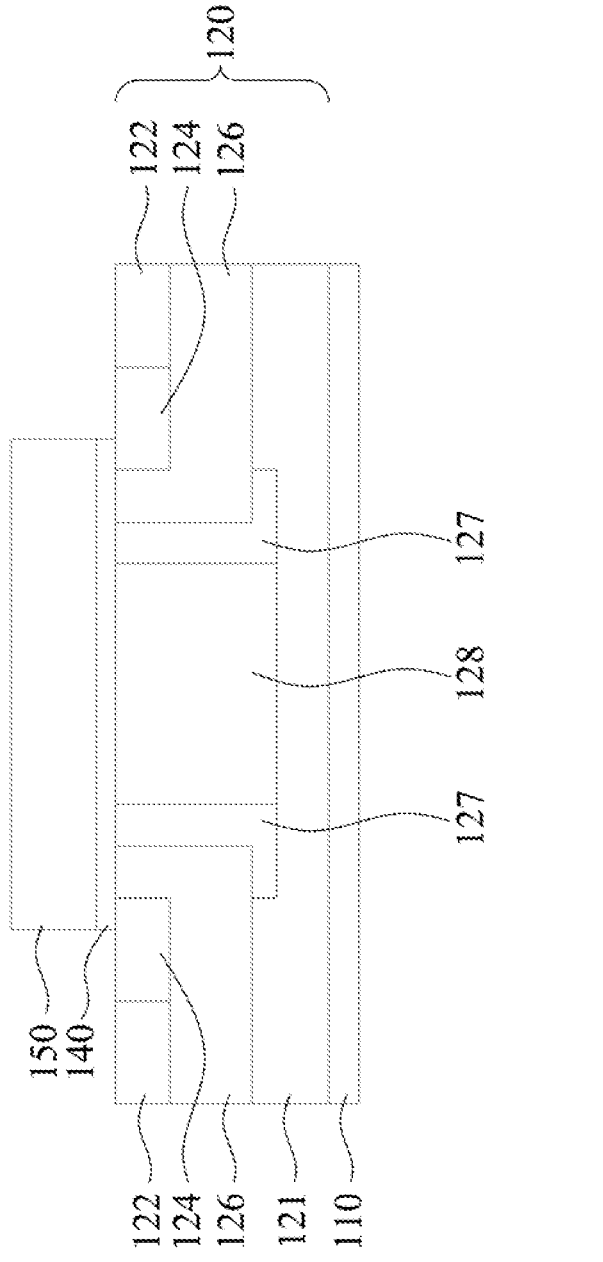

Referring to FIG. 17, the gate dielectric layer 140 and the gate layer 150 are formed on the epitaxial layer 120 by patterning the dielectric layer 142 and the conductive layer 152. The conductive layer 152 may be firstly patterned to form the gate layer 150. Subsequently, the dielectric layer 142 may be patterned to form the gate dielectric layer 140 by using the gate layer 150 as mask. Therefore, the sidewall of the gate dielectric layer 140 and the sidewall of the gate layer 150 may be aligned with each other. The gate dielectric layer 140 is in contact with the source region 124, and the gate dielectric layer 140 covers the surface of the epitaxial layer 120. That is, the gate dielectric layer 140 may extend from a source region 124 to another source region 124.

Figure 18:
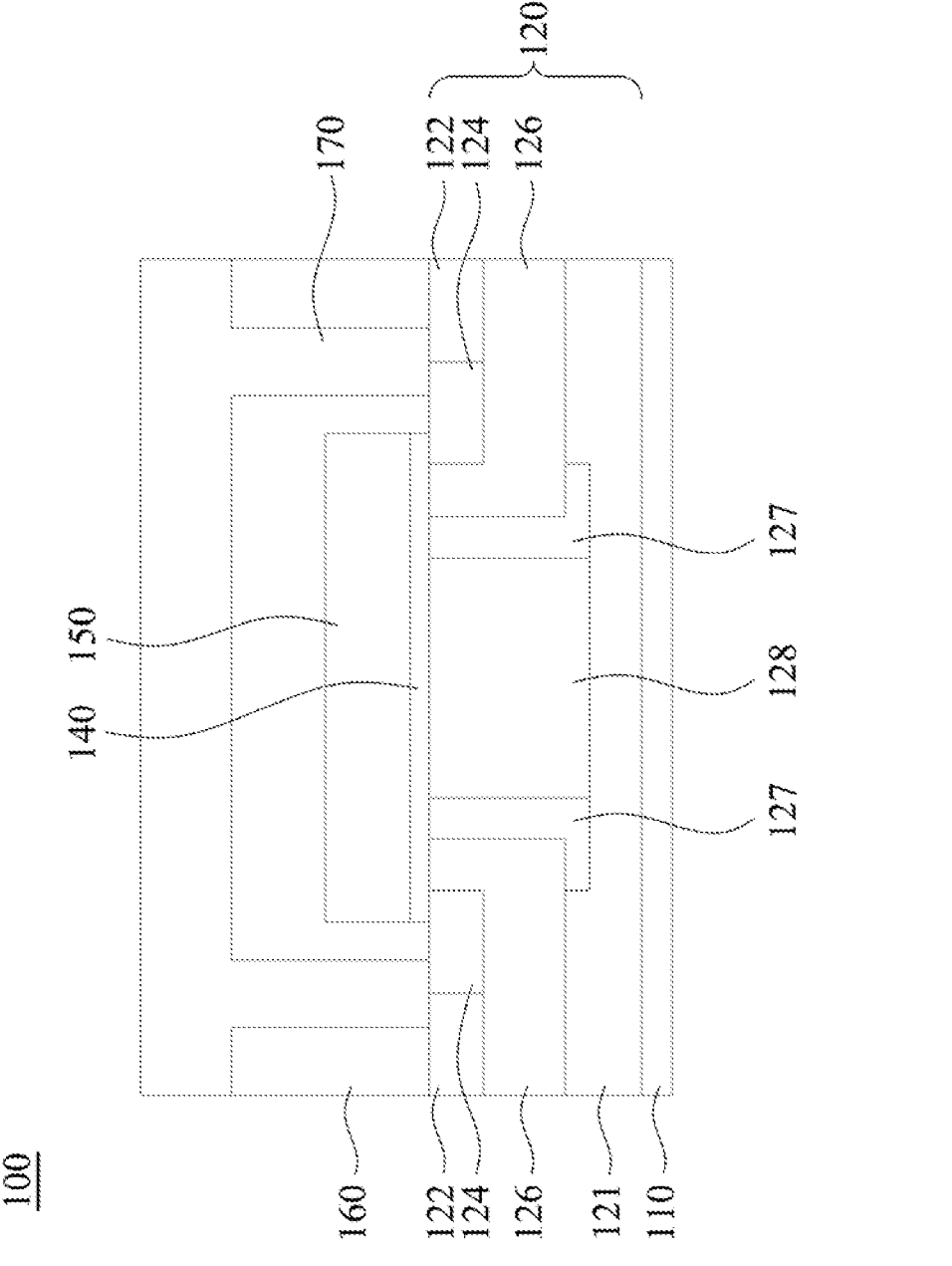
Figure 19:
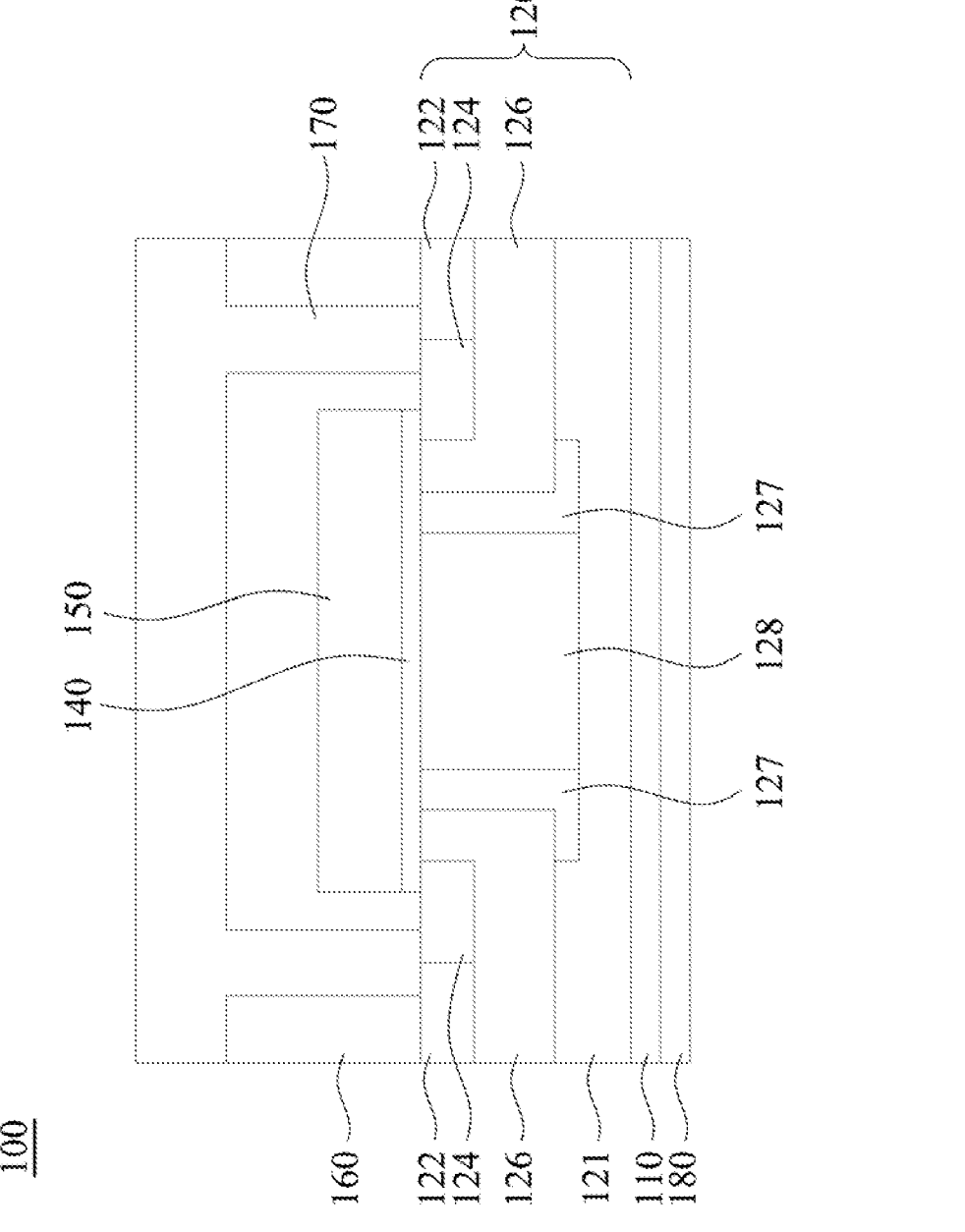

Subsequently, referring to FIG. 18, the dielectric layer 160 may be formed on the gate dielectric layer 140 and the gate layer 150. Subsequently, the source contact 170 is formed in the dielectric layer 160. More specifically, the dielectric layer 160 may be firstly formed on the gate dielectric layer 140 and the gate layer 150, so that the dielectric layer 160 covers the gate dielectric layer 140, the gate layer 150 and the epitaxial layer 120. Subsequently, openings are formed in the dielectric layer 160, and the source contact 170 is formed in the openings. The source contact 170 is in contact with the base regions 122 and the source regions 124. Referring to FIG. 19, the drain electrode 180 is formed below the substrate 110. The drain electrode 180 is below the substrate 110 and is contact with the substrate 110.

Figure 20:
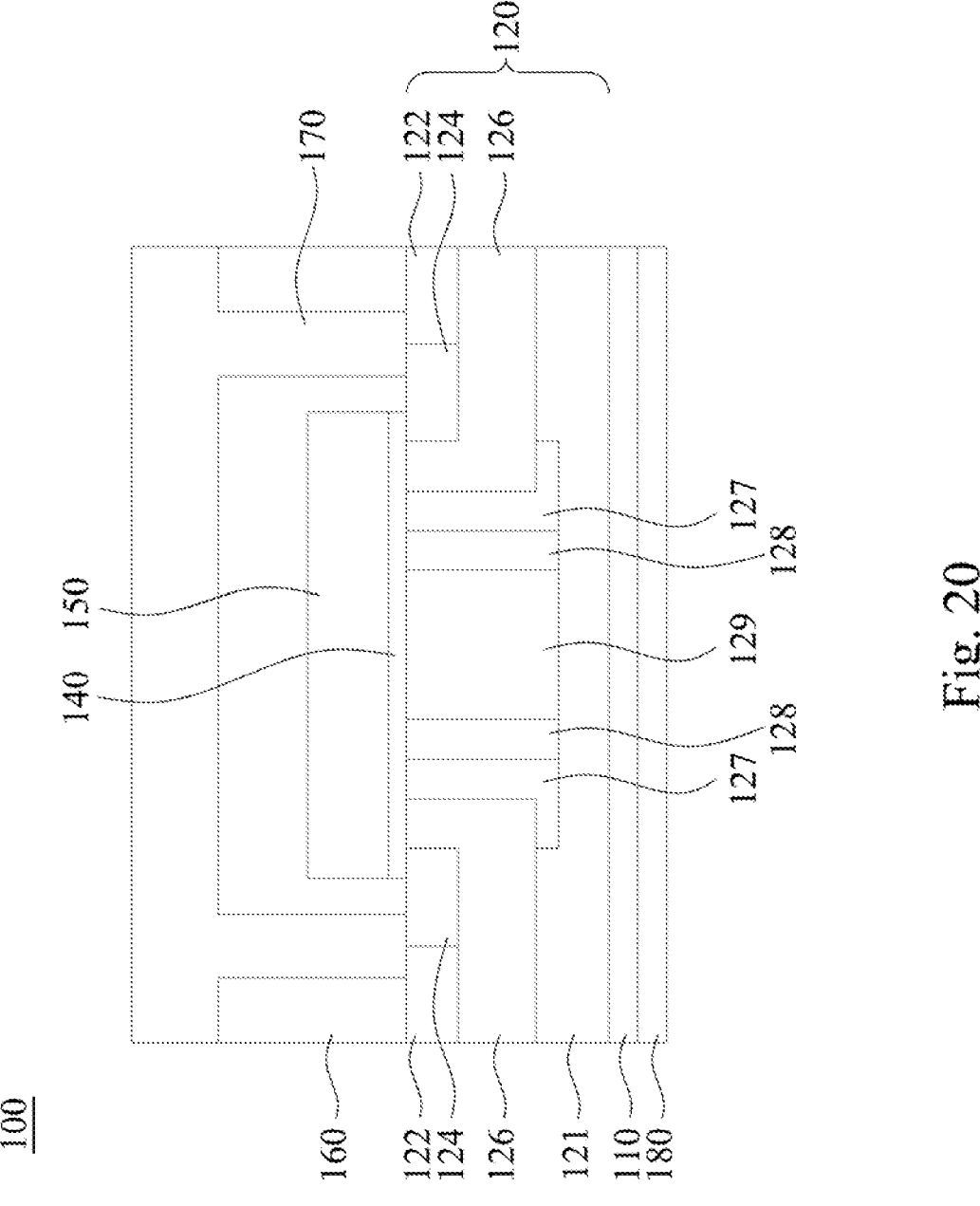
FIG. 20 illustrates a cross-section view of the semiconductor device in some other embodiments of the present disclosure.

FIG. 20 illustrates a cross-section view of the semiconductor device 100 in some other embodiments of the present disclosure. In some embodiments, more JFET regions are formed in the semiconductor device 100, so that the resistance of the JFET regions may be reduced effectively and the breakdown voltage of the semiconductor device 100 is maintained at a certain level. In some embodiments, the semiconductor device 100 further includes a third JFET region 129. The third JFET region 129 is adjacent to the second JFET region 128. The third JFET region 129 includes dopants of the first semiconductor type, and the doping concentration of the third JFET region 129 is higher than the doping concentration of the second JFET region 128. In some other embodiments, the semiconductor device 100 may include more JFET regions, and generally, the doping concentration of the JFET region increases from the edge of the well region 126 to the center of the JFET region.

The third JFET region 129 may be formed after FIG. 14. After the process in FIG. 14, additional spacer may be formed at the sidewall of the spacer 138. Subsequently, the third JFET region 129 may be formed in the second JFET region 128 by using the additional spacer as mask. That is, the process of using spacers to form different JFET regions may be performed multiple times to form JFET regions at different doping concentration.

As mentioned above, the semiconductor device in some embodiments of the present disclosure includes JFET region at different doping concentration. When the doping concentration of the JFET region is lower near the well region and higher at the center, and the doping concentration of the JFET region is higher than the drift region below, the resistance of the JFET region of the semiconductor device may be reduced. Moreover, the dropping of the breakdown voltage, which may cause the semiconductor to be unable to withstand too much driving voltage, of the semiconductor device may be avoided.

It is to be understood, however, that even though numerous characteristics and advantages of the present invention have been set forth in the foregoing description, together with details of the structure and function of the invention, and changes may be made in detail, especially in matters of shape, size, and arrangement of parts within the principles of the invention to the full extent indicated by the broad general meaning of the terms in which the appended claims are expressed.

What is claimed is:

1. A semiconductor device, comprising:
   a substrate;
   an epitaxial layer at a side of the substrate;
   a well region in the epitaxial layer;
   a source region in the well region;
   a base region in the well region and adjacent to the source region;
   a first junction field-effect transistor region adjacent to the well region;
   a second junction field-effect transistor region in the first junction field-effect transistor region, the first junction field-effect transistor region and the second junction field-effect transistor region comprising dopants of a first semiconductor type, wherein a doping concentration of the second junction field-effect transistor region is higher than a doping concentration of the first junction field-effect transistor region, and a bottom of the first junction field-effect transistor region and a bottom of the second junction field-effect transistor region are closer to the substrate than a bottom of the well region is, and the bottom of the first junction field-effect transistor region expands below the bottom of the well region;
   a gate dielectric layer at a side of the epitaxial layer away from the substrate; and
   a gate layer at a side of the gate dielectric layer away from the epitaxial layer.

2. The semiconductor device of claim 1, wherein the well region comprising dopants of a second semiconductor type, and the second semiconductor type is different from the first semiconductor type.

3. The semiconductor device of claim 1, wherein the well region clads a bottom of the source region and a bottom of the base region.

4. The semiconductor device of claim 1, further comprising:

a drift region in the epitaxial layer, wherein the doping concentration of the first junction field-effect transistor region and the doping concentration of the second junction field-effect transistor region is higher than a doping concentration of the drift region; and a third junction field-effect transistor region adjacent to the second junction field-effect transistor region, the first junction field-effect transistor region comprising dopants of the first semiconductor type, wherein a doping concentration of the third junction field-effect transistor region is higher than the doping concentration of the second junction field-effect transistor region.

5. The semiconductor device of claim 4, wherein a bottom of the third junction field-effect transistor region is closer to the substrate than the bottom of the well region is.

6. The semiconductor device of claim 1, further comprising:

a source contact in contact with the source region.

7. The semiconductor device of claim 1, further comprising:

a drain electrode at the other side of the substrate.

8. A manufacturing method of a semiconductor device, comprising:

forming an epitaxial layer on a substrate;

forming a base region in the epitaxial layer;

forming a sacrificial layer stack on the epitaxial layer, wherein the sacrificial layer stack comprises a first sub-layer and a second sub-layer on the first sub-layer;

retracting a sidewall of the second sub-layer of the sacrificial layer stack;

forming a source region adjacent to the base region by using the second sub-layer as mask;

retracting the sidewall of the second sub-layer of the sacrificial layer stack again;

forming a well region cladding the base region and the source region by using the second sub-layer after being retracted again;

depositing a third sub-layer on the first sub-layer of the sacrificial layer stack and surrounding the second sub-layer;

removing the second sub-layer, and forming a first junction field-effect transistor region adjacent to the well region by using the third sub-layer as mask;

forming a spacer at a sidewall of the third sub-layer of the sacrificial layer stack; and forming a second junction field-effect transistor region in the first junction field-effect transistor region by using the spacer as mask.

9. The manufacturing method of claim 8, further comprising:

removing the sacrificial layer stack after forming the second junction field-effect transistor region; and performing an annealing process on the first junction field-effect transistor region and the second junction field-effect transistor region.

10. The manufacturing method of claim 9, further comprising:

forming a dielectric layer on the epitaxial layer after performing the annealing process;

forming a conductive layer on the dielectric layer; and forming a gate dielectric layer and a gate layer on the epitaxial layer by patterning the dielectric layer and the conductive layer.

11. The manufacturing method of claim 8, wherein after forming the first junction field-effect transistor region, a bottom of the first junction field-effect transistor region is closer to the substrate than a bottom of the well region is.

12. The manufacturing method of claim 11, wherein after forming the second junction field-effect transistor region, a bottom of the second junction field-effect transistor region is closer to the substrate than a bottom of the well region is.

13. The manufacturing method of claim 8, wherein after forming the first junction field-effect transistor region, a bottom of the first junction field-effect transistor region expands below the bottom of the well region.

14. The manufacturing method of claim 8, wherein a doping concentration of the second junction field-effect transistor region is higher than a doping concentration of the first junction field-effect transistor region.

15. The manufacturing method of claim 8, wherein after forming the base region, the epitaxial layer is divided into the base region and a drift region, and after forming the first junction field-effect transistor region, a doping concentration of the first junction field-effect transistor region is higher than a doping concentration of the drift region.

16. The manufacturing method of claim 8, wherein the first sub-layer and the third sub-layer of the sacrificial layer stack are made of same materials, and the first sub-layer and the second sub-layer of the sacrificial layer stack are made of different materials.

17. The manufacturing method of claim 8, wherein a length of the spacer is in a range of 50 nm to 200 nm.

18. The manufacturing method of claim 8, wherein a length of the second sub-layer after being retracted again is in a range of 0.8 micron to 1.2 micron.

19. The manufacturing method of claim 8, further comprising forming a third junction field-effect transistor region adjacent to the second junction field-effect transistor region, wherein a doping concentration of the third junction field-effect transistor region is higher than a doping concentration of the second junction field-effect transistor region.

* * * * *